(12) United States Patent  
Shakuda

(10) Patent No.: US 8,399,895 B2
(45) Date of Patent: Mar. 19, 2013

(54) SEMICONDUCTOR LIGHT EMITTING DEVICE

(75) Inventor: Yukio Shakuda, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 322 days.

(21) Appl. No.: 12/735,376

(22) PCT Filed: Jan. 9, 2009

(86) PCT No.: PCT/JP2009/050249
§ 371 (c)(1),
(2), (4) Date: Jul. 9, 2010

(87) PCT Pub. No.: WO2009/088084
PCT Pub. Date: Jul. 16, 2009

(65) Prior Publication Data
US 2010/0289041 A1  Nov. 18, 2010

(30) Foreign Application Priority Data
Jan. 11, 2008  (JP) .................................. 2008-004292

(51) Int. Cl.
*H01L 27/15* (2006.01)

(52) U.S. Cl. ............ 257/93; 257/E27.121; 257/E33.066
(58) Field of Classification Search .................... 257/88, 257/93, E33.006, E33.062, E33.065, E33.066
See application file for complete search history.

(56) References Cited

U.S. PATENT DOCUMENTS 6,307,218 B1 * 10/2001 Steigerwald et al. ........... 257/99
7,511,311 B2 * 3/2009 Kususe et al. .................... 257/95

FOREIGN PATENT DOCUMENTS

| JP | 08-116093 A | 5/1996 |
| JP | 2000-164930 A | 6/2000 |
| JP | 2003068109 A | 3/2003 |
| JP | 2004-006582 A | 1/2004 |
| WO | WO-2006/068297 A1 | 6/2006 |
| WO | WO-2007/018360 A1 | 2/2007 |

* cited by examiner

*Primary Examiner* — Zandra Smith
*Assistant Examiner* — Paul Patton
(74) *Attorney, Agent, or Firm* — Rabin & Berdo, P.C.

(57) ABSTRACT

Provided is a semiconductor light emitting device which includes a number of hexagon-shaped semiconductor light emitting elements formed two-dimensionally, and in which the positive electrodes and the negative electrodes are formed on its light outputting surface side lest the light outputting efficiency should decrease. A mask 11 for selective growth is formed on a substrate 1 for growth, and an AlN buffer layer 2 is formed in regions from each of which a part of the mask 11 for selective growth is removed. An undoped GaN layer 3, an n-type GaN layer 4, an active layer 5 and a p-type GaN layer 6 are sequentially stacked on the AlN buffer layer 2. An isolation groove A for isolating the elements from one another is formed. A p-electrode 8 and an n-electrode 7 of each semiconductor light emitting element D are formed on its hexagon-shaped light outputting surface side, and the p-electrodes or n-electrodes of each two neighboring semiconductor light emitting elements are arranged adjacent to each other with the isolation groove A in between.

11 Claims, 10 Drawing Sheets

FIG. 2
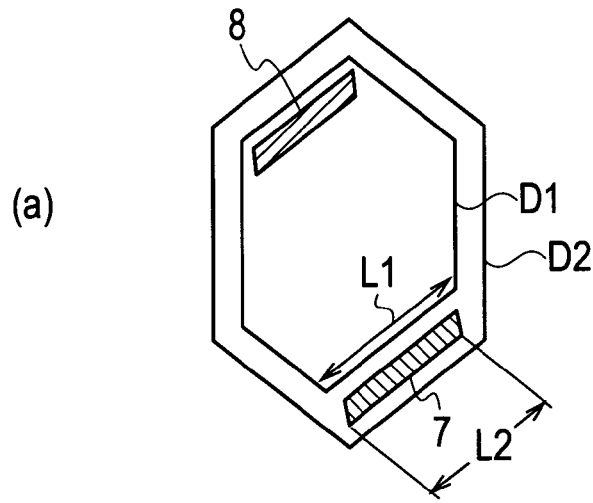
(a)
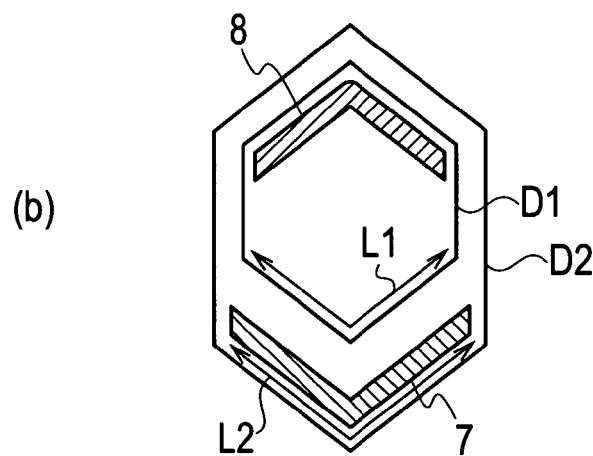
(b)
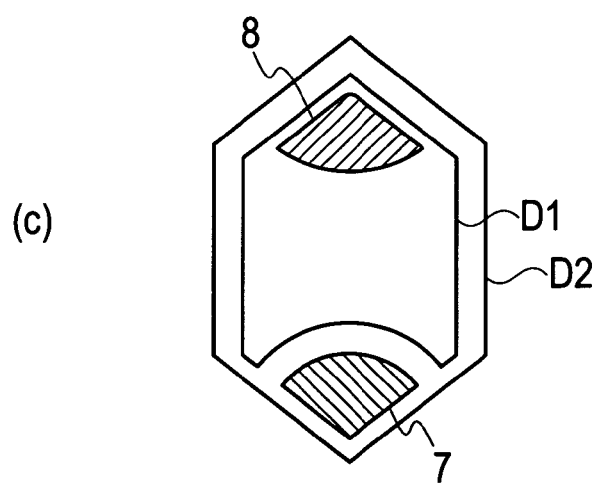
(c)

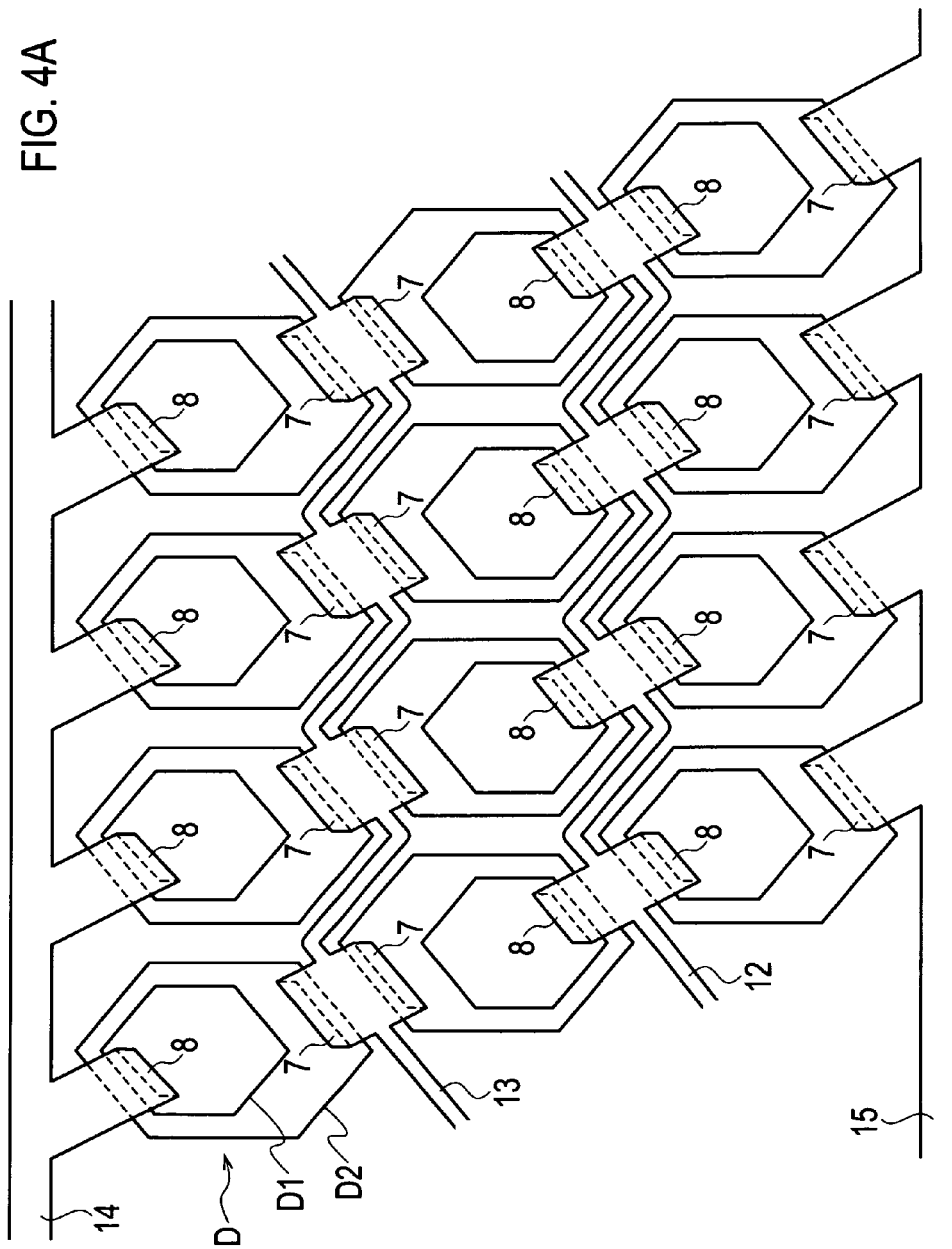

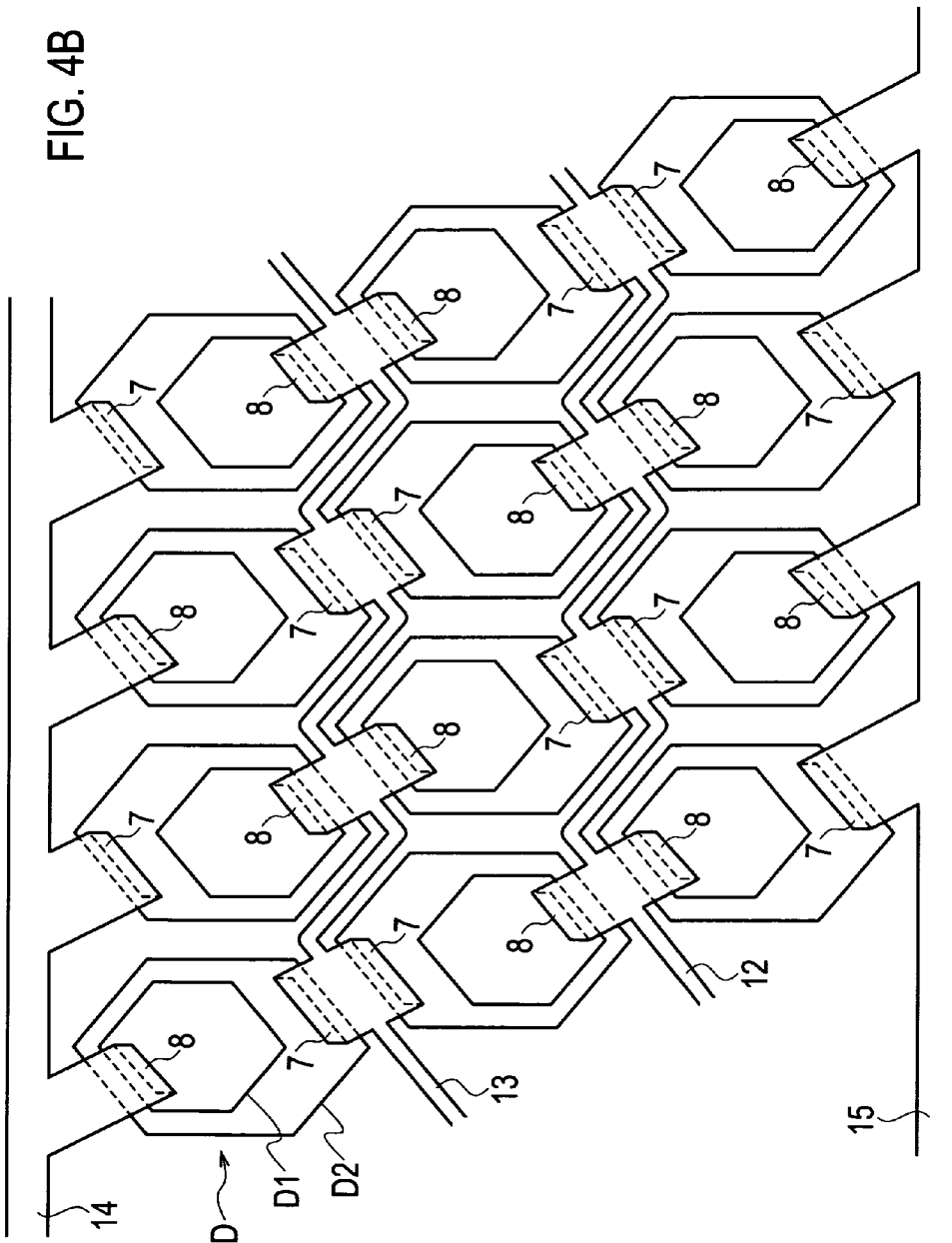

SEMICONDUCTOR LIGHT EMITTING DEVICE

TECHNICAL FIELD

The present invention relates a semiconductor light emitting device including a large number of semiconductor light emitting elements formed two-dimensionally.

BACKGROUND ART

A Semiconductor light emitting element including multiple compound semiconductor layers stacked one on another on a substrate has been heretofore known. An LED (light emitting diode) is known as a typical semiconductor light emitting element. In the LED, a pn or pin junction of compound semiconductors (GaAs, GaP, AlGaAs, or the like) is formed. The LED utilizes a light-emitting phenomenon occurring through recombination of carriers, which are injected into the junction by applying a forward voltage to the junction.

Such an LED has conventionally been manufactured by: epitaxially growing a compound semiconductor such as GaAs, AlGaAs, InP or InGaAsP on a single-crystal substrate of GaAs, InP or the like using a crystal growth method such as LPE (liquid phase epitaxy), MOCVD (metal organic chemical vapor deposition), VPE (vapor phase epitaxy) and MBE (molecular beam epitaxy) with the compound semiconductor being lattice-matched to the substrate; and processing the epitaxially-grown compound semiconductor.

In recent years, a nitride semiconductor is in use for a blue LED, which is used as a light source and the like for illumination or back light, or for an LED, an LD and the like, which are used for multi-color effects. In the case of the nitride semiconductor light emitting element, a pn or pin junction is formed on a substrate such as a sapphire substrate by MOCVD or the like.

The semiconductor light emitting element is formed as described above. A semiconductor light emitting device including a large number of semiconductor light emitting elements of this kind which are formed and arrayed on a common substrate has been manufactured (see Patent Document 1, for instance).

Patent Document 1: Japanese Patent Application Publication No. 2004-6582

DISCLOSURE OF THE INVENTION

Problems to be Solved by the Invention

When multiple semiconductor light emitting elements are formed on a common substrate as described above, each of the semiconductor light emitting elements formed isolated from one another is shaped like a circle, a square or a rectangle. When light emitting elements are intended to be arrayed in a high density design, each of the light emitting elements is usually shaped like a rectangle, and the electrode thereof is usually shaped like a rectangle after the shape of the elements.

For instance, in a case where elements are formed in a one-dimensional array with their p-electrodes (positive electrodes) and n-electrodes (negative electrodes) located on the same side which is the light outputting side, interconnections for connecting the respective electrodes to their electrode pads for wire bonding are alternately led out to the end portions located on the opposite sides in a direction perpendicular to the direction in which the elements are arranged in the one-dimensional array.

However, in a case where elements are formed in a two-dimensional array, it is not easy to lay out interconnections for connecting the p-electrode and the n-electrode of each element and the electrode pads for wire bonding. If the interconnections are laid out crossing the light outputting surfaces of the elements, the interconnections block light from the light outputting surfaces. Thus, the two-dimensional array design has a problem that, as the ratio of the light-blocked area increases, the light outputting efficiency decreases significantly.

For instance, a nitride semiconductor has a hexagonal crystal structure, and has a crystal polarity which causes Ga atoms or N atoms to be in a growth surface direction (grows in the c-axis direction). With this taken into consideration, a proposal has been made on a semiconductor light emitting element: which is formed in the shape of a hexagon; and which has the p-electrode and the n-electrode arranged on the hexagon-shaped light outputting surface.

In the case where elements are arrayed in a high density design, the hexagonal shape of the elements as described above brings about a problem that the hexagonal shape makes it more difficult to connect the n-electrodes and the p-electrodes to the electrodes for wire bonding than a circular or rectangular element does, and thus makes the ratio of the light-blocking area larger.

The present invention has been devised to solve the above-described problems. An object of the present invention is to provide a semiconductor light emitting device in which: a number of hexagon-shaped semiconductor light emitting elements are two-dimensionally formed; and positive electrodes and negative electrodes are formed on the light outputting surface side lest the light outputting efficiency should decrease.

Means for Solving the Problems

To achieve the above object, an invention of claim 1 is a semiconductor light emitting device in which a plurality of hexagon-shaped semiconductor light emitting elements are formed two-dimensionally on a substrate, the semiconductor light emitting device characterized in that, in each semiconductor light emitting element, a positive electrode and a negative electrode are formed on a hexagon-shaped light outputting surface side, and the positive electrodes or the negative electrodes of each two neighboring ones of the semiconductor light emitting elements are arranged adjacent to each other with an isolation groove in between, the isolation groove isolating the semiconductor light emitting elements from one another.

An invention of claim 2 is a semiconductor light emitting device in which a plurality of hexagon-shaped semiconductor light emitting elements are two-dimensionally formed two-dimensionally on a substrate, the semiconductor light emitting device characterized in that, in each semiconductor light emitting element, a positive electrode and a negative electrode are formed on a hexagon-shaped light outputting surface side, and a positive electrode of one of each two neighboring ones of the semiconductor light emitting elements and a negative electrode of the other element are arranged adjacent to each other with an isolation groove in between, the isolation groove isolating the semiconductor light emitting elements from one another.

An invention according to claim 3 is the semiconductor light emitting device according to any one of claims 1 and 2, characterized in that, in each semiconductor light emitting element, the positive electrode and the negative electrode are each formed in a shape using one side of, or two sides meeting at a vertex of, the hexagon, and the positive electrode and the negative electrode are arranged opposed to each other.

An invention according to claim 4 is the semiconductor light emitting device according to claim 3, characterized in that at least one of the positive electrode and the negative electrode of each semiconductor light emitting element is formed in a shape of a rectangle including long sides which are parallel to the one side of the hexagon being the shape of the element.

An invention according to claim 5 is the semiconductor light emitting device according to claim 3, characterized in that at least one of the positive electrode and the negative electrode of each semiconductor light emitting element is formed in a V-shape using two sides parallel respectively to the two sides meeting at the vertex of the hexagon being the shape of the element.

An invention according to claim 6 is the semiconductor light emitting device according to claim 3, characterized in that at least one of the positive electrode and the negative electrode of each semiconductor light emitting element is formed in a shape of any one of a sector and a triangle using two sides parallel respectively to the two sides meeting at the vertex of the hexagon being the shape of the element.

An invention according to claim 7 is the semiconductor light emitting device according to any one of claims 1 to 6, characterized in that a metal electrode for wire bonding is continuously formed stretching across front surfaces respectively of at least two adjacent ones of the semiconductor light emitting elements, the metal electrode configured to supply an electric power to the semiconductor light emitting device.

An invention according to claim 8 is the semiconductor light emitting device according to claim 7, characterized in that the metal electrode are continuously formed stretching across the top surface and side surface of each of the semiconductor light emitting elements.

Effects of the Invention

In the case of one invention: the multiple hexagon-shaped semiconductor light emitting elements are formed two-dimensionally on the substrate with the isolation grooves in between; the positive electrode and the negative electrode are provided in the hexagon-shaped light outputting surface side of each semiconductor light emitting element; and the positive electrodes of each two neighboring semiconductor light emitting elements are arranged adjacent to each other with the isolation groove in between, whereas the negative electrodes of the two neighboring semiconductor light emitting elements are arranged adjacent to each other with the isolation groove in between. Accordingly, the electrode connection using an interconnection can be achieved by connecting the electrodes of each two neighboring semiconductor light emitting elements with the same polarity in the shortest distance without crossing a light outputting surface. For this reason, the present invention can makes the number of needed interconnections smaller than in a case where each of the electrodes is connected to the electrode for wire bonding, and accordingly reduces the ratio of the light-blocked area. Furthermore, the present invention enables interconnections for connecting the inter-electrode interconnections to be placed in the isolation grooves, and accordingly the power supply lines are formed without crossing the light outputting surfaces.

In the case of the other invention: the multiple hexagon-shaped semiconductor light emitting elements are formed two-dimensionally on the substrate with the isolation grooves in between; the positive electrode and the negative electrode are provided in the hexagon-shaped light outputting surface side of each semiconductor light emitting element; and in each of the two neighboring semiconductor light emitting elements, the positive electrode of one element and the negative electrode of the other element of are arranged adjacent to each other with the isolation groove in between. Accordingly, the electrode connection using an interconnection can be achieved by connecting the electrodes of each two neighboring semiconductor light emitting elements with the different polarities in the shortest distance without crossing a light outputting surface, and interconnections may be laid out from end portions of the elements arrayed two-dimensionally to the electrodes for wire bonding. For this reason, the invention allows almost no light to be blocked by the interconnections, and makes the effect particularly higher. Furthermore, the present invention enables interconnections for connecting the inter-electrode interconnections to be placed in the isolation grooves, and accordingly the power supply lines are formed without crossing the light outputting surfaces.

BRIEF DESCRIPTION OF THE DRAWINGS

FIG. 2 is a diagram showing examples of shapes of the positive and negative electrodes of a semiconductor light emitting element of the semiconductor light emitting device according to the present invention.

FIG. 4A is a plan view showing an interconnection state in a case where the semiconductor light emitting elements are connected in parallel.

FIG. 4B is a plan view showing another interconnection state in the case where the semiconductor light emitting elements are connected in parallel.

Figure 1:
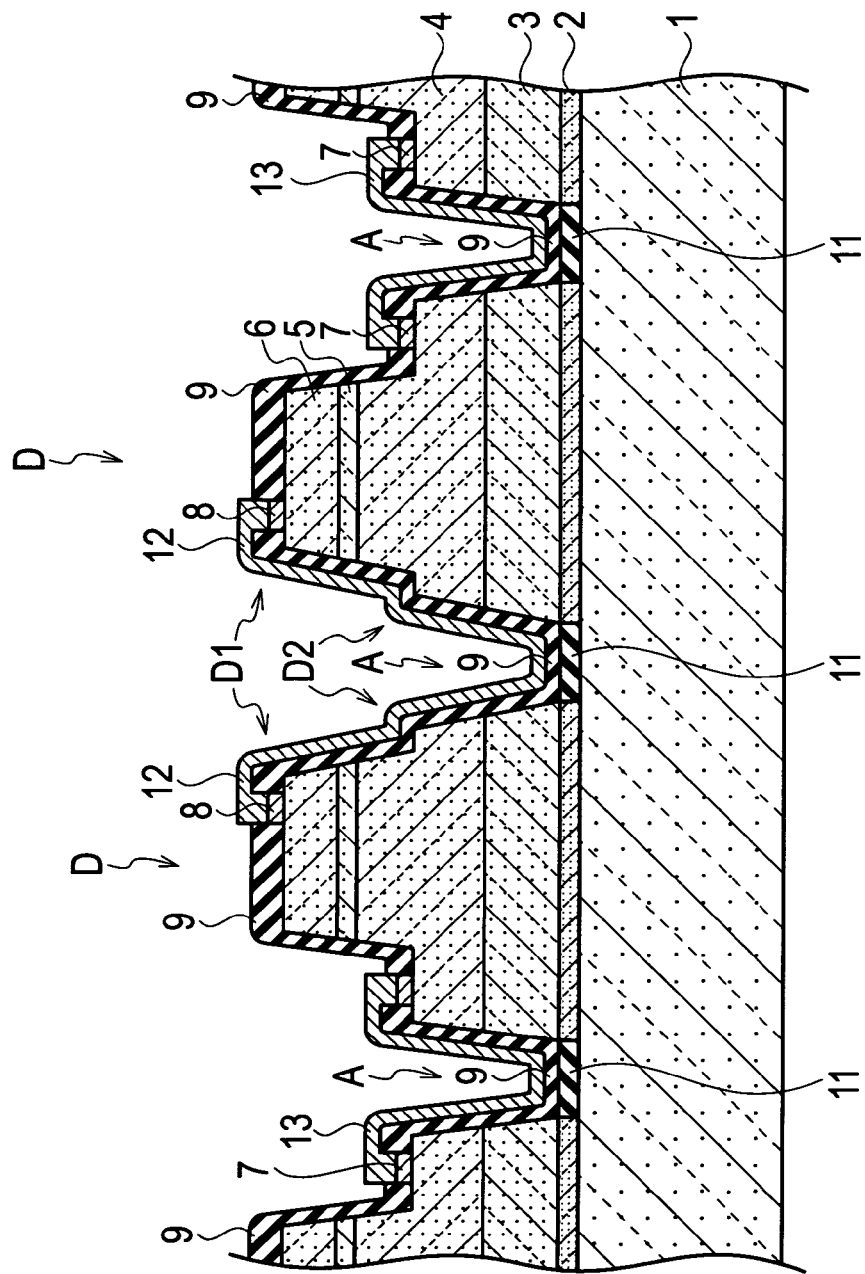
FIG. 1 is a diagram showing an example of a cross-sectional structure of a semiconductor light emitting device according to the present invention.

EXPLANATION OF REFERENCE NUMERALS 1, 31 substrate for growth
2, 32 AlN buffer layer
3, 33 undoped GaN layer
4, 34 n-type GaN layer
5, 35 active layer
6, 36 p-type GaN layer
7, 39 n-electrode
8, 40 p-electrode
11 mask for selective growth

BEST MODES FOR CARRYING OUT THE INVENTION

Referring to the drawings, descriptions will be hereinafter provided for an embodiment of the present invention. FIG. 1 shows a semiconductor light emitting device of the present invention which is formed on one wafer.

The semiconductor light emitting device of the present invention includes a number of semiconductor light emitting elements two-dimensionally formed on a common substrate. Although the semiconductor light emitting elements may be made of a semiconductor such as GaAs, AlGaAs, InP or InGaAsP, the semiconductor light emitting elements made of a nitride semiconductor will be given as an example in this embodiment.

The nitride semiconductor is made by MOCVD or the like which has been already known. In this respect, the nitride semiconductor is quaternary mixed crystal AlGaInN, and is what is termed as a group III-V nitride semiconductor. The nitride semiconductor can be expressed with $Al_xGa_yIn_zN$ ($x+y+z=1$, $0 \leq x \leq 1$, $0 \leq y \leq 1$, $0 \leq z \leq 1$).

A mask 11 for selective growth is formed on a substrate 1 for growth, and an AlN buffer layer 2 is formed in regions from which a part of the mask 11 for selective growth is removed. An undoped GaN layer 3, an n-type GaN layer 4, an active layer 5 and a p-type GaN layer 6 are sequentially stacked on the AlN buffer layer 2. These semiconductor layers are made by MOCVD. Semiconductor light emitting elements D are formed by a method termed as epitaxial lateral overgrowth in a way that the semiconductor light emitting elements D are isolated from one another. An isolation groove A for isolating the elements is formed just on the mask 11 for selective growth. In this respect, selective growth and epitaxial lateral overgrowth (ELO) are well known as the methods which cause less displacement.

In addition, the active layer 5 has a multiple quantum-well structure which includes barrier layers made of GaN and well layers made of $In_{x1}Ga_{1-X1}N$ ($0<X1$). Though a sapphire substrate or the like is used as the substrate 1 for growth, any substrate may be used as long as the substrate has a hexagonal structure (wurtzite structure). Moreover, an n-type GaN layer doped with an impurity Si may be included instead of the undoped GaN layer 3.

When the AlN buffer layer 2 to the p-type GaN layer 6 are selectively grown, an insulating film is used as the mask 11 for selective growth. $SiO_2$, $Si_3N_4$, $ZrO_2$ and the like may be used for the insulating film.

For the purpose of making mesas, the p-type GaN layer 6 is etched until parts of the n-type GaN layer 4 are exposed to the outside. Thereby, hexagon-shaped mesa regions D1 are formed. Accordingly, each semiconductor light emitting element D includes a base region D2 and the mesa region D1. An n-electrode (negative electrode) 7 is provided on each exposed part of the n-type GaN layer 4, whereas a p-electrode (positive electrode) 8 is provided on the p-type GaN layer 6. Furthermore, a transparent electrode made of ZnO or the like may be formed on the p-type GaN layer 6, although not illustrated. In the case where the transparent electrode is formed, the p-electrode 8 is provided on the transparent electrode. The p-electrode 8 is formed as an Al/Ni metal multilayer film or the like, and the n-electrode 7 is also formed as an Al/Ni metal multilayer film or the like.

A top surface of each semiconductor light emitting element D, except for the upper surfaces of the p-electrode 8 and the n-electrode 7, is covered with an insulating film 9. $SiO_2$, $Si_3N_4$, $ZrO_2$ or the like, which is highly insulating and transparent to a luminous wavelength, is used for the insulating film 9. Contact holes are respectively made in parts of the insulating film 9 which are on the n-electrode 7 and the p-electrode 8. The n-electrode 7 and the p-electrode 8 are connected to a metal interconnection 13 and a metal interconnection 12, respectively, via the contact holes. A Ni/Al or Ti/Al metal multilayer film may be used for the metal interconnections 12, 13. In a case where the Ni/Al metal multilayer film is used, the thickness of the Ni and the thickness of Al may be, for instance, 300 Å and 8000 Å, respectively. In a case where the Ti/Al metal multilayer film is used, the thickness of the Ti and the thickness of the Al may be, for instance, 500 Å and 8000 Å, respectively.

FIG. 4A is a plan view of the structure shown in FIG. 1 viewed from above. FIG. 4A illustrates the semiconductor light emitting device, excluding the insulating film 9 for the purpose of making clear a relationship among the n-electrodes 7, the p-electrodes 8, and the metal interconnections 12, 13. In this respect, light emitted from each active layer 5 is designed to be outputted from the p-electrode 8-side, that is to say, from the upper surface of the p-type GaN layer 6, as shown in FIG. 1.

Furthermore, FIGS. 1 and 4A show the configuration in which, in each group of semiconductor light emitting elements D, the p-electrodes 8 and the n-electrodes 7 are connected to electrodes with the same polarity so that the semiconductor light emitting elements D are connected in parallel. As shown in FIG. 4A, the p-electrodes 8 of each two neighboring semiconductor light emitting elements are formed adjacent to each other with the isolation groove A for isolating the elements from one another in between, except for electrodes which are connected to either of metal interconnections 14, 15 in end portions. Moreover, out of the metal interconnections 12, 13, 14, 15, at least two metal interconnections are respectively connected to electrodes for wire bonding although not illustrated, and are thus supplied with voltages.

Accordingly, the p-electrodes 8 of each two neighboring semiconductor light emitting elements can be connected together in the shortest distance without crossing the light outputting surface, whereas the n-electrodes 7 of each two neighboring semiconductor light emitting elements can be connected together in the same manner. Furthermore, each interconnection connecting the inter-electrode interconnections can be placed in an area of the isolation groove A. In this respect, as shown in FIG. 4A, each of the metal interconnections 12, 13 may be formed by integrating the inter-electrode interconnections and a connection interconnection connecting the inter-electrode interconnections. In this manner, the number of interconnections which might otherwise be laid out crossing the light outputting surfaces can be reduced. Accordingly, the light outputting efficiency can be kept high. Otherwise, as shown in FIG. 4B, a number of semiconductor light emitting elements may be arrayed in a way that the semiconductor light emitting elements are connected together in parallel with the polarities of each two neighboring semiconductor light emitting elements being alternated.

Figure 5:
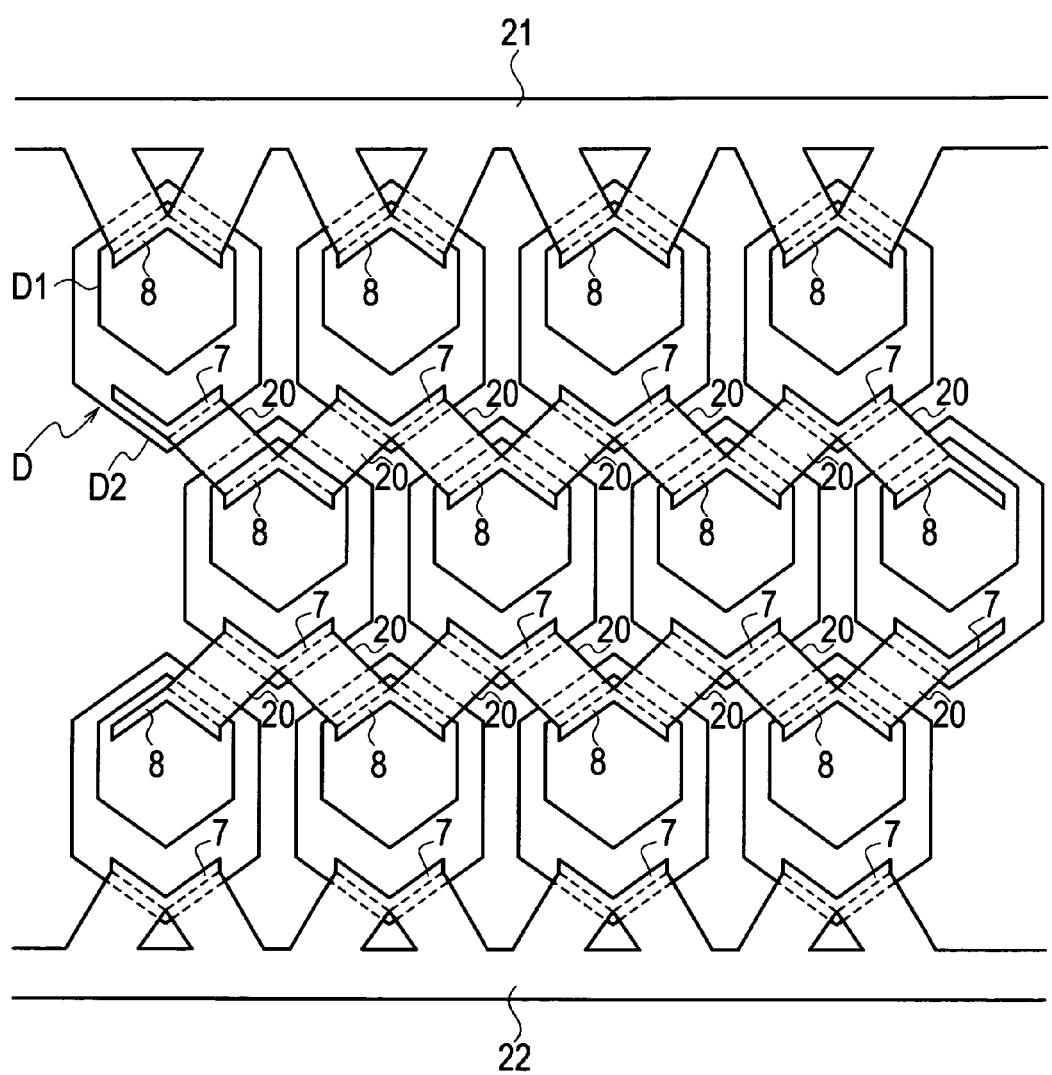
FIG. 5 is a plan view showing an interconnection state in a case where the semiconductor light emitting elements are connected in series.

On the other hand, FIG. 5 is a plan view showing another arrangement of the semiconductor light emitting elements D viewed from above. FIG. 5 illustrates the semiconductor light emitting elements D, excluding the insulating film 9. Unlike FIGS. 4A and 4B, FIG. 5 shows the configuration in which the p-electrode 8 and the n-electrode 7 of each semiconductor light emitting element D are connected to electrodes with different polarity so that the semiconductor light emitting elements D are connected together in series.

As shown in FIG. 5, the semiconductor light emitting elements are formed in a way that, in each two neighboring semiconductor light emitting elements, the p-electrode 8 of one element is adjacent to the n-electrode 7 of the other element with the isolation groove A for isolating the elements from one another in between, except for electrodes connected to either of metal interconnections 21, 22 in the end portions. In this manner, a metal interconnection 20 for connecting electrodes may be formed in a way to divide from an electrode of any one element to the electrodes of the two neighboring elements. In addition, the metal interconnections 21, 22 are connected to the respective electrodes for wire bonding although not illustrated, and are supplied with voltages.

Accordingly, each metal interconnection 20 between the p-electrode 8 and the n-electrode 7 adjacent to each other with the isolation groove in between is capable of connecting the electrodes in the shortest distance without crossing the light outputting surface. Because the number of interconnections which might otherwise be laid out while crossing light outputting surfaces can be reduced to virtually zero, the effect becomes high particularly in a case where the semiconductor light emitting elements are connected together in series. Consequently, the light outputting efficiency can be kept high.

Note that the Ni/Al or Ti/Al metal multilayer film may be used as the material for the metal interconnections 14, 15, 21, 22 as in the case of the metal interconnections 12, 13. In the case where the Ni/Al metal multilayered film is used, the thickness of the Ni and the thickness of the Al may be, for instance, 300 Å and 8000 Å, respectively. In the case where the Ti/Al metal multilayered film is used, the thickness of the Ti and the thickness of the Al may be, for instance, 500 Å and 8000 Å, respectively.

In all the configurations shown in FIGS. 4A, 4B and 5, interconnections for connecting the p-electrodes of two neighboring semiconductor light emitting elements, as well as the interconnections for connecting the p-electrode and the n-electrode of two neighboring semiconductor light emitting elements, are made to avoid all the 12 vertices which are formed in each of the hexagon-shaped semiconductor light emitting elements D. The electric field of each semiconductor light emitting element D concentrates at the vertices of the hexagon of the base region D2 and the vertices of the hexagon of the mesa region D1 in the semiconductor light emitting element D, because corners are respectively formed at all the vertices. For this reason, if the inter-electrode interconnection is formed crossing any one of the 12 vertices formed in the semiconductor light emitting element D, the interconnection and the semiconductor light emitting element D become easy to short-circuit. Thus, such configurations are applied to avoid the short circuit.

On the other hand, FIG. 2 shows shapes of the p-electrode 8 and the n-electrode 7 which are formed in each semiconductor light emitting element D. FIG. 2 is a plan view showing the semiconductor light emitting element D shown in FIG. 1 viewed from above. The electrodes are formed in their respective positions so that the light emitting areas in active layer 5 are largest and connections by the interconnections between the neighboring light emitting elements are simple.

The p-electrode 8 and the n-electrode 7, which are made of metal, reflect or absorb light, and accordingly decrease the efficiency of outputting light from the p-type GaN layer 6. In this context, it is desirable to particularly reduce the area of the p-electrode 8. However, if the area of the p-electrode 8 is reduced too much, there is a problem that the contact resistance increases. With this taken into consideration, as shown in FIGS. 2(a) to 2(c), the p-electrode and the n-electrode are formed in a shape of one side of a hexagon analogous to the shape of the element or of two sides of the hexagon which meet at a vertex, and are arranged opposed to each other, so that the contact area with the p-type GaN layer 6 can be secured to some extent and at the same time the area with high light output is not blocked.

Note that both the p-electrode 8 and the n-electrode 7 are each formed to have an area which is approximately 10% to 20% of the area of the hexagon of the semiconductor light emitting element D, specifically, an outer hexagon in FIG. 2.

In FIG. 2(a), the p-electrode 8 and the n-electrode 7 are each formed in the shape of a rectangle including long sides parallel to one side of the hexagon being the shape of the semiconductor light emitting element D. In FIG. 2(b), the p-electrode 8 and the n-electrode 7 each have two sides parallel to two sides of the hexagon meeting at a vertex, the hexagon having the shape of the semiconductor light emitting element, and are accordingly each formed in the shape of the letter V. In FIG. 2(c), the p-electrode 8 and the n-electrode 7 each have two sides parallel to two sides of the hexagon meeting at a vertex, the hexagon having the shape of the semiconductor light emitting element, and are accordingly each formed in the shape of a sector. Alternately, the p-electrode 8 and the n-electrode 7 may be each formed in the shape of a triangle by replacing the arc in the sector shown FIG. 2(c) with a straight line.

In this respect, as shown in FIGS. 2(a) and 2(b), the total longitudinal length of the n-electrode 7 is denoted by L2, and the total length of one side of the hexagon-shaped mesa region D1 which is opposed to the n-electrode 7 is denoted by L1. L2 indicates a length of the n-electrode 7 placed in an area outside an area which contributes to the light emission. No matter how L2 may increase, L2 does not affect the light outputting efficiency. Meanwhile, for the purpose of shortening the inter-electrode interconnection and reducing the contact resistance of the n-electrode 7, it is desirable to increase the area of the n-electrode 7 by increasing L2. For these reasons, it is desirable to set L2 equal to or longer than L1.

In addition, the p-electrode 8 and the n-electrode 7 need not necessarily be formed in the same shape as in FIGS. 2(a) to 2(c), and instead may be a combination of the shapes shown in FIGS. 2(a) to 2(c). For instance, the p-electrode 8 may have a shape shown in FIG. 2(a) whereas the n-electrode 7 may have a shape shown in FIG. 2(b). Any combination of the shapes shown in FIGS. 2(a) to 2(c) may be applied to the p-electrode and the n-electrode.

Descriptions will be hereinbelow provided for a method of manufacturing the semiconductor light emitting devices as shown in FIGS. 1, 4 and 5. Firstly, the mask 11 for selective growth is formed on the substrate 1 for growth. For instance, as the substrate 1 for growth, a sapphire substrate is placed in an MOCVD (metal organic chemical vapor deposition) apparatus, and the sapphire substrate is thermally cleaned by raising the temperature to approximately 1050° C. while causing a hydrogen gas to flown in the MOCVD apparatus. Thereafter, as the mask 11 for selective growth, $SiO_2$ being the insulating film is formed on the sapphire substrate. A film of $SiO_2$ with a film thickness of approximately 1000 Å is formed on the sapphire substrate by sputtering Ar atoms as the sputtered atoms which are supplied at a rate of 20 cc/minute at a sputtering power of 300 W under an atmosphere with a pressure of 1 Pa for 20 minutes.

Figure 3:
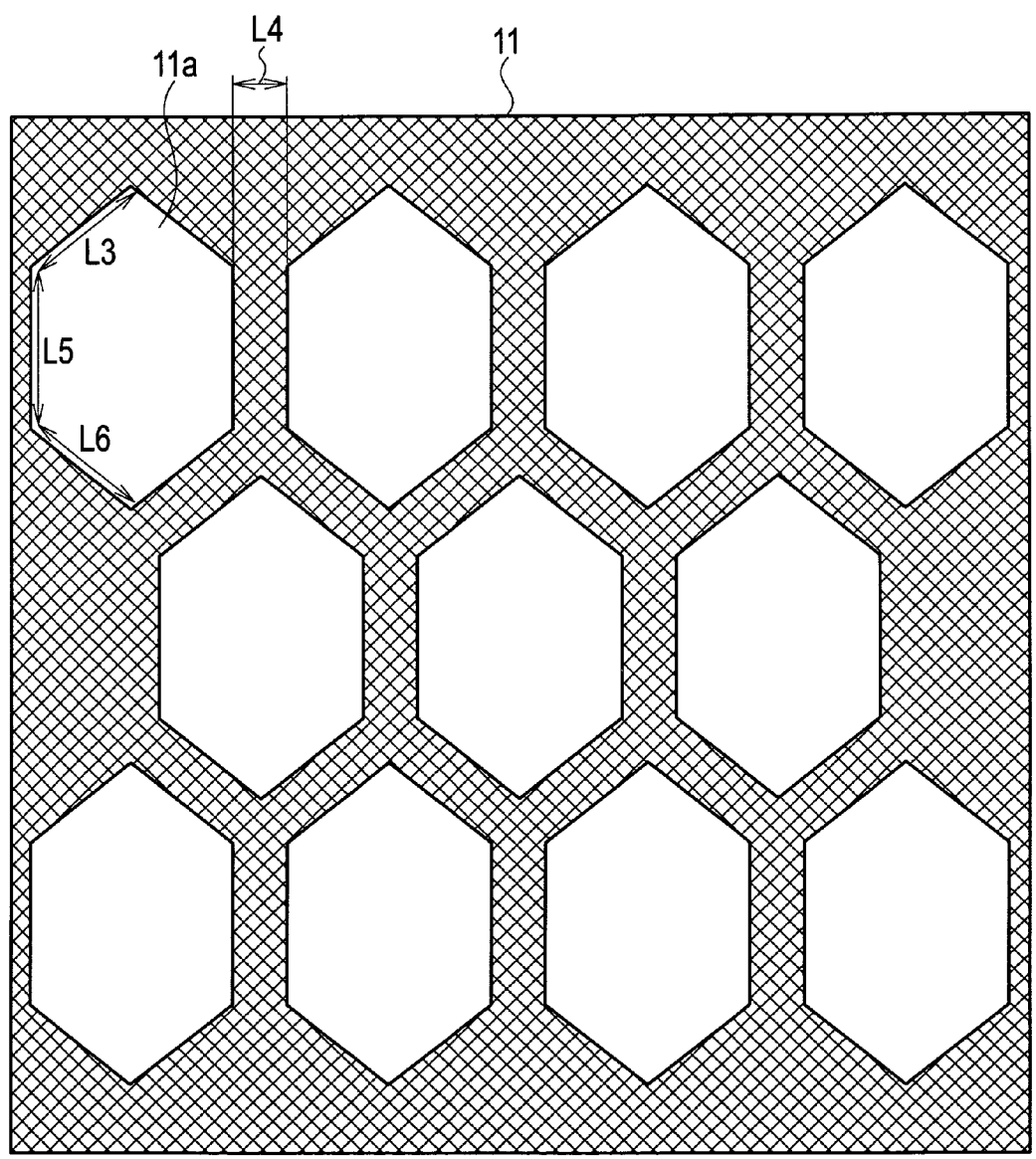
FIG. 3 is a diagram showing an example of a shape of a mask for selective growth.

Subsequently, a resist is formed in a predetermined pattern on the $SiO_2$ film by the photolithographic technique. Afterward, dry-etching is performed, for instance, by supplying a plasmatic $CF_4$ gas under a pressure of 3 Pa at a power of 100 W. At this time, as described later, the mask 11 for selective growth is patterned as shown in FIG. 3.

After that, the AlN buffer layer 2 is grown. This AlN buffer layer 2 is a high-temperature AlN layer. The growth is performed at a temperature of 900° C. or higher (for instance, 900° C.), under the growth pressure of 200 Torr, by using a hydrogen gas as the carrier gas. Here, the flow rate of the carrier hydrogen gas ($H_2$) is 14 L/minute, the flow rate of TMA (trimethylaluminum) is 20 cc/minute, and the flow rate of $NH_3$ (ammonia) is 500 cc/minute. In this respect, a calculated molar ratio of $NH_3$ to TMA is approximately 2600:1. The high-temperature AlN buffer layer 2 with a film thickness of 30 Å is formed under the above growth conditions. Note that examples of the insulating film used as the mask 11 for selective growth include a $Si_3N_4$ film and a $ZrO_2$ film in addition to the $SiO_2$ film mentioned above.

The stacking of the AlN buffer layer 2 with this scheme enables the AlN buffer layer 2 to be formed not only with a thinner thickness, but also in a way that the AlN buffer layer 2 fills the gaps in the mask 11 for selective growth without depositing on the mask 11 for selective growth.

In order to form the isolated semiconductor light emitting elements D as shown in FIGS. 1, 4A, 4B and 5, the longitudinal growth rate needs to be set larger than the lateral growth rate. To this end, the opening portions of the mask 11 for selective growth are made by removing the corresponding portions from the insulating film. FIG. 3 shows the shape of the opening portions.

The mask 11 for selective growth in which a large number of hexagon-shaped opening portions 11a are made as shown 3 is used. The hexagon-shaped elements are obtained through this process. The nitride semiconductor has the wurtzite (hexagonal) crystal structure along the (0001) direction, and a crystal polarity which causes Ga atoms or N atoms to be in a growth surface direction (grows in the c-axis direction).

For this reason, the sapphire substrate or the like which has the same wurtzite crystal structure is used as the substrate for growth. In a case the principal plane of the sapphire substrate has the C-plane and the nitride semiconductor is deposited on the principle plane, the C-plane of all the grown crystals is the growth surface direction. In this case, when the mask for selective growth having the hexagon-shaped opening portions 11a as shown in FIG. 3 is used, the placement of any one of the sides L3, L5, L6 of the hexagon in parallel with the M-plane of the substrate for growth makes the selectively-grown crystals grow almost in the longitudinal direction, and the thus-grown crystals accordingly constitute the isolated semiconductor layers.

Note that it is desirable to set the following relationship among L3 to L6 in order to grow crystals in the longitudinal direction. It does not matter whether or not the length of L3 is equal to that of L6. In a case where L3 and L6 are different in length, the difference in length is desirably within 10%. L4 is desirably shorter than L3, L6, specifically approximately 5% to 20% of the length of L3. Furthermore, L5 is desirably equal to or longer than L3.

Subsequently, the undoped GaN layer 3 is deposited with a thickness of approximately 0.5 µm. Here, in the MOCVD apparatus, the growth temperature is set to 1020° C. to 1040° C., and while the supply of the $NH_3$ gas continued, the supply of TMA stopped, and, for instance, trimethylgallium (TMGa) is supplied at a flow rate of 20 µmol/minute.

Thereafter, the n-type GaN layer 4 is grown to have a film thickness of approximately 4 µm with silane ($SiH_4$) being supplied as an n-type dopant gas. Afterward, the supply of TMGa and silane is stopped, and the temperature of the substrate is lowered to a temperature in a range of 700° C. to 800° under an atmosphere of a mixture of ammonia and hydrogen. Under this condition, an undoped GaN barrier layer of the active layer 5 is deposited by supplying triethylgallium (TEGa) at a flow rate of 20 µmol/minute, and a InGaN well layer is deposited by supplying trimethylindium (TMIn) at a flow rate of 200 µmol/minute. After that, the deposition of the GaN barrier layer and the InGaN well layer are repeated alternately, and the multiple quantum-well structure is thus formed. The active layer 5 has a film thickness of, for example, approximately 0.1 µm.

Once the active layer 5 is grown, the growth temperature is raised to 1020° C. to 1040° C. The p-type GaN layer 6 doped with an impurity Mg is then grown to have a thickness of approximately 0.3 µm by supplying trimethylgallium (TMGa) being a material gas for Ga atoms, ammonia ($NH_3$) being a material gas for nitrogen atoms, and $CP_2MG$ (biscyclopentadienylmagnesium) being the dopant material of the p-type impurity Mg.

A mesa is made by etching the P-type GaN layer 6 until the n-type GaN layer 4 is exposed. In a case where a transparent electrode is formed, as the transparent electrode, a ZnO film with a film thickness of approximately 2000 Å is formed on the p-type GaN layer 6, and the p-electrode 8 is formed on the transparent electrode. The n-electrode 9 is formed on the exposed surface of the n-type GaN layer 4. On the other hand, in a case where the structure includes no transparent electrode, the p-electrode 8 is formed on the p-type GaN layer 6.

Thereafter, as the insulating film 9, $SiO_2$ is deposited throughout the entire top surface of the wafer with a thickness of approximately 0.5 µm to 2 µm. Plasma CVD is used to cover the top surface of the wafer with $SiO_2$. $SiO_2$ film with a thickness of approximately 0.5 µm to 2 µm is formed by supplying silane ($SiH_4$) at a flow rate of 10 cc/minute and supplying $N_2O$ at a flow rate of 500 cc/minute at a power of 300 W at a growth temperature of 400° C.

Subsequently, parts of $SiO_2$ on the p-electrodes 8 and n-electrodes 7 are removed, and the contact holes are formed. In the cases shown in FIG. 4A, 4B, the metal interconnection 12 connects the p-electrodes 8 together through the contact holes without crossing the vertexes of the hexagons, whereas the metal electrode 13 connects the n-electrodes 7 together in the same manner. In addition, with regard to the semiconductor light emitting elements arranged in end portions among a large number of semiconductor light emitting elements D formed two-dimensionally, the metal interconnection 14 connects the p-electrodes 8 together and the metal interconnection 15 connects the n-electrodes 7 without crossing the vertexes of the hexagons. At least two of these metal interconnections 12, 13, 14, 15 are connected to the respective electrodes for wire bonding, although not illustrated.

On the other hand, in the case of FIG. 5, each of the metal interconnection 20 connects the corresponding p-electrode 8 and n-electrode 7 respectively of the elements, which are adjacent to each other with the isolation groove in between, through the contact holes without crossing the vertexes of the hexagons. In addition, with regard to the semiconductor light emitting elements arranged in end portions among a large number of semiconductor light emitting elements D formed two-dimensionally, the metal interconnection 21 connects the p-electrodes 8 together and the metal interconnection 22 connects the n-electrodes 7 together without crossing the vertexes of the hexagons. The metal interconnections 21, 22 are connected to the respective electrodes for wire bonding, although not illustrated.

Note that the semiconductor layers are each manufactured to have desired composition, desired conduction type and desired thickness by sequentially growing the semiconductor layers at a temperature in a range of 700° C. to 1200° C. by supplying hydrogen or nitrogen being the carrier gas and gases needed to form the semiconductor layers. The needed gases include: the reactant gas corresponding to the components of each semiconductor layer, such as triethylgallium (TEGa), trimethylgallium (TMG), ammonia ($NH_3$), trimethylaluminum (TMA) and trimethylindium (TMIn); silane ($SiH_4$) as the dopant gas for changing the semiconductor layer to n-type; and $CP_2Mg$ (cyclopentadienylmagnesium) as the dopant gas for changing the semiconductor layer to p-type.

An electric power needs to be supplied from the outside to activate the semiconductor light emitting device, which includes a large number of hexagon-shaped semiconductor light emitting elements formed two-dimensionally as shown in FIGS. 4A, 4B and 5. To this end, a wire is bonded to supply the electric power to some semiconductor light emitting elements. In this respect, a metal for wire bonding may be formed on one specific semiconductor element in order for the metal to be connected to the wire, and the metal for wire bonding may be connected to the wire.

Figure 7:
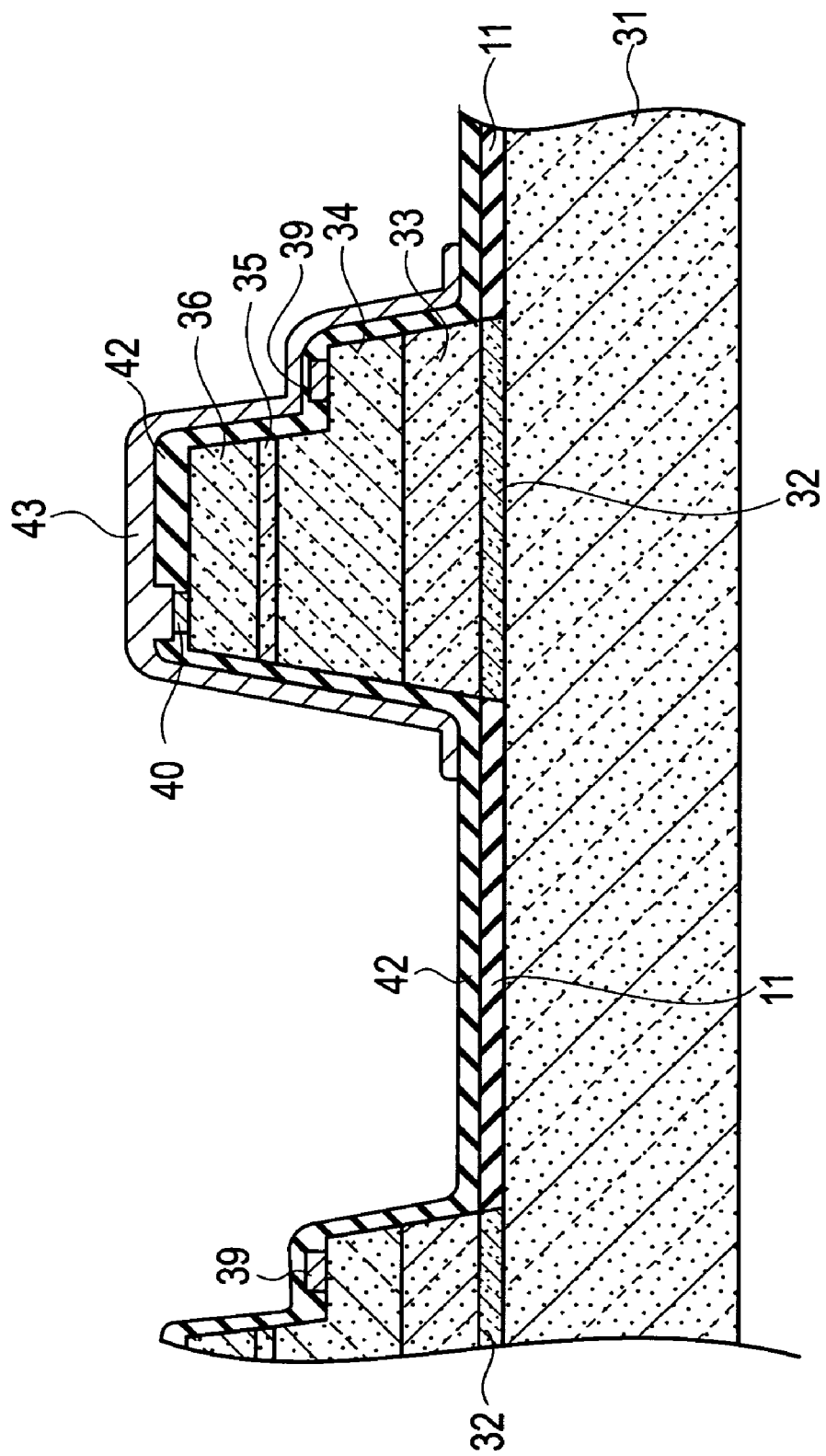
FIG. 7 is a diagram showing an example of a cross-sectional structure of the semiconductor light emitting device taken along the B-B of FIG. 8.
Figure 8A:
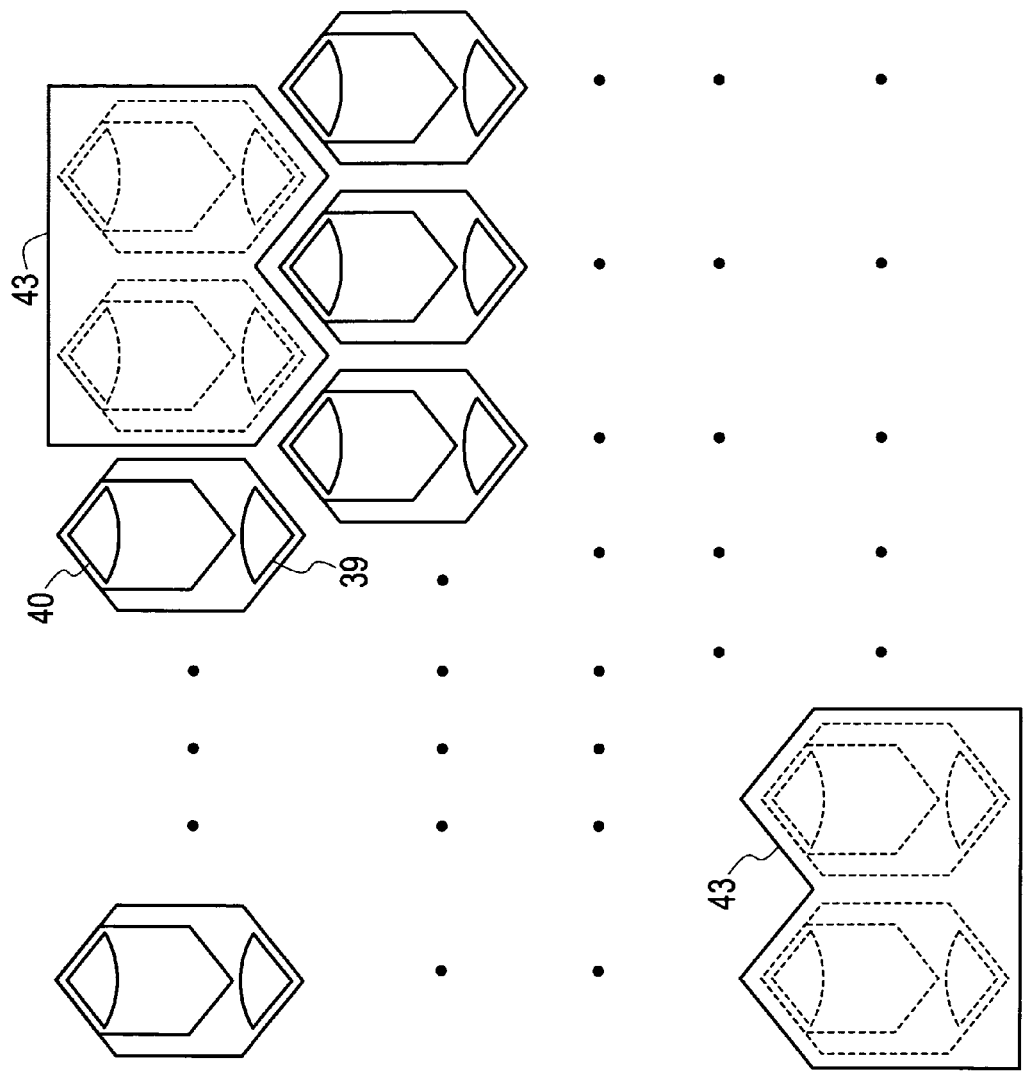
FIG. 8A is a plan view of a semiconductor light emitting device in which electrodes for wire bonding are formed.
Figure 8B:
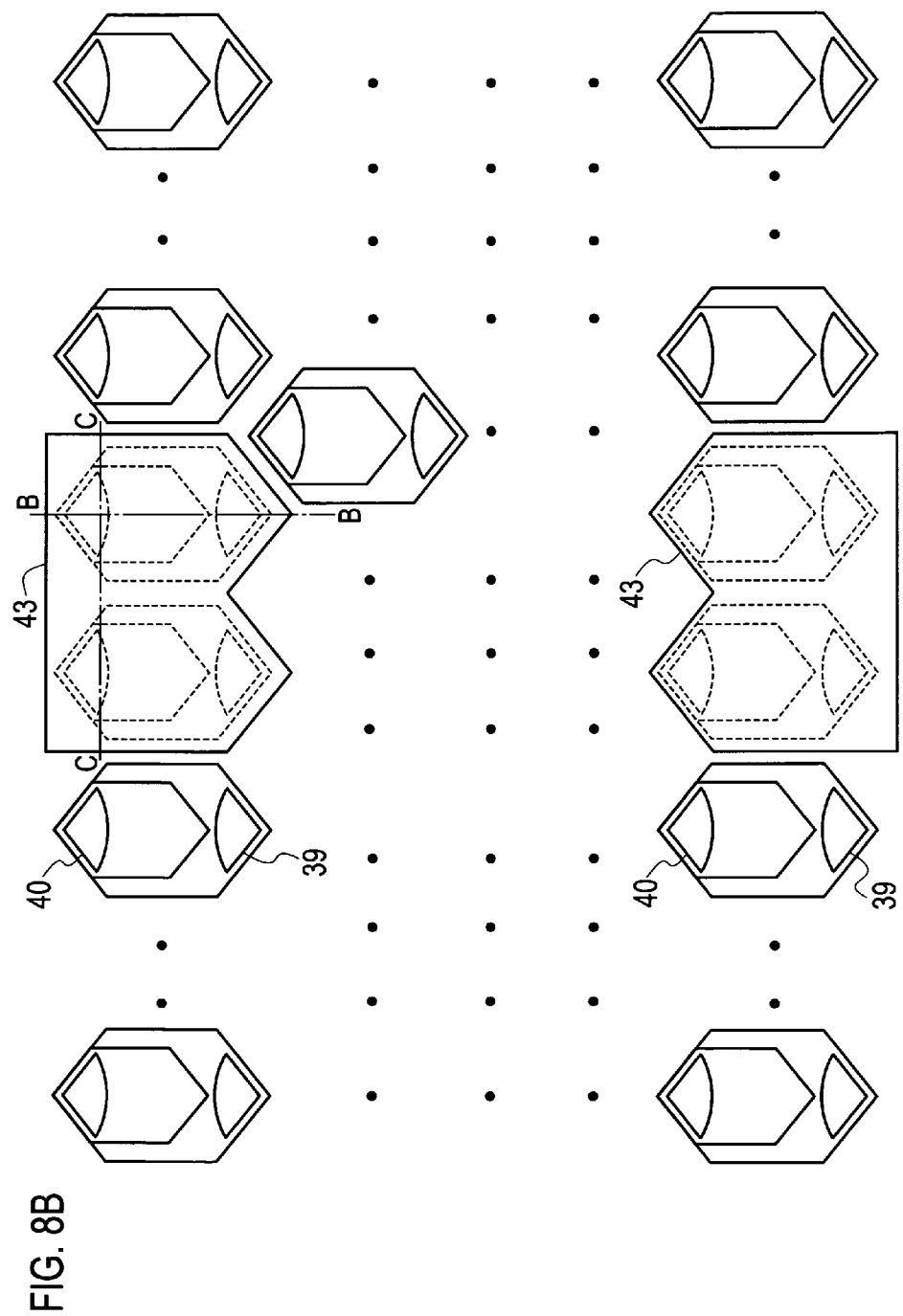
FIG. 8B is a plan view of another semiconductor light emitting device in which electrodes for wire bonding are formed.

FIGS. 8A and 8B are plan views of semiconductor light emitting devices according to modifications viewed from above, respectively. In the drawings, an insulating film 42 is excluded to make the illustrations clear. The C-C cross section of FIG. 8B corresponds to FIG. 6, and the B-B cross section of FIG. 8B corresponds to FIG. 7. Like the semiconductor light emitting devices shown in FIGS. 1, 4A, 4B, 5, each of the semiconductor light emitting devices shown in FIGS. 8A and 8B includes a number of hexagon-shaped semiconductor light emitting elements which are formed two-dimensionally on an substrate while isolated from one another by an isolation groove. Each semiconductor light emitting element has a positive electrode and a negative electrode in the hexagon-shaped light outputting surface side. In this respect, the sectors shown in FIG. 2(c) are used for the shapes of the p-electrode and the n-electrode. Two semiconductor light emitting elements arranged side-by-side in the center of FIG. 6, and semiconductor light emitting elements drawn by dotted lines in each of FIGS. 8A and 8B are shown as semiconductor light emitting elements used for wire bonding. Specifically, FIG. 8A shows an example in which the semiconductor light emitting elements used for wire bonding are placed in the corners of the semiconductor light emitting device, whereas FIG. 8B shows an example in which the semiconductor light emitting elements used for wire bonding are placed in the centers of the upper and lower sides of the semiconductor light emitting device.

When the metal electrode for wire bonding is formed, for instance, across each two neighboring light emitting elements in this manner, the metal for wire bonding is hard to come off even in a case where the wire is subjected to an excessive force during an assembling step, the transfer step and the like after the wire bonding, and the handling is easy. The stacking configuration is the same as that of the semiconductor light emitting device shown in FIG. 1, except for the metals 43 for bonding. Descriptions will be hereinbelow provided for the stacking configuration.

The mask 11 for selective growth is formed on a substrate 31 for growth. An AlN buffer layer 32 is formed in regions from which a part of the mask 11 for selective growth is removed. An undoped GaN layer 33, an n-type GaN layer 34, an active layer 35 and a p-type GaN layer 36 are sequentially stacked on the AlN buffer layer 32. These semiconductor layers are made by MOCVD. The semiconductor light emitting elements Dare formed by a method termed as the epitaxial lateral overgrowth (ELO) in a way that the semiconductor light emitting elements are isolated from one another. An isolation groove for isolating the elements from one another is formed just on the mask 11 for selective growth.

In addition, the active layer 35 has a multiple quantum-well structure which includes barrier layers made of GaN and well layers made of $In_{X1}Ga_{1-X1}N$ (0<X1). Though a sapphire substrate or the like is used as the substrate 31 for growth, any substrate may be used as long as the substrate has a hexagonal structure (wurtzite structure). Moreover, an n-type GaN layer doped with an impurity Si may be included instead of the undoped GaN layer 33.

When the AlN buffer layer 32 to the p-type GaN layer 36 are selectively grown, an insulating film is used as the mask 11 for selective growth. $SiO_2$, $Si_3N_4$, $ZrO_2$ and the like may be used for the insulating film.

For the purpose of making mesas, the p-type GaN layer 36 is etched until parts of the n-type GaN layer 4 are exposed to the outside. Thereby, mesa regions are formed. An n-electrode (negative electrode) 39 is provided on each exposed part of the n-type GaN layer 34, whereas a p-electrode (positive electrode) 40 is provided on the p-type GaN layer 36. The p-electrode 40 is formed as an Al/Ni metal multilayer film or the like, and the n-electrode 39 is also formed as an Al/Ni metal multilayer film or the like.

A top surface of each semiconductor light emitting element, except for the upper surfaces of the p-electrode 40 and the n-electrode 39, is covered with an insulating film 42. $SiO_2$, $Si_3N_4$, $ZrO_2$ or the like, which is highly insulating, is used for the insulating film 42. Contact holes are respectively made in parts of the insulating film 42 which are on the n-electrode 39 and the p-electrode 40. Although not illustrated, the n-electrode 39 and the p-electrode 40 are connected to metal interconnections, respectively, via the contact holes.

Figure 6:
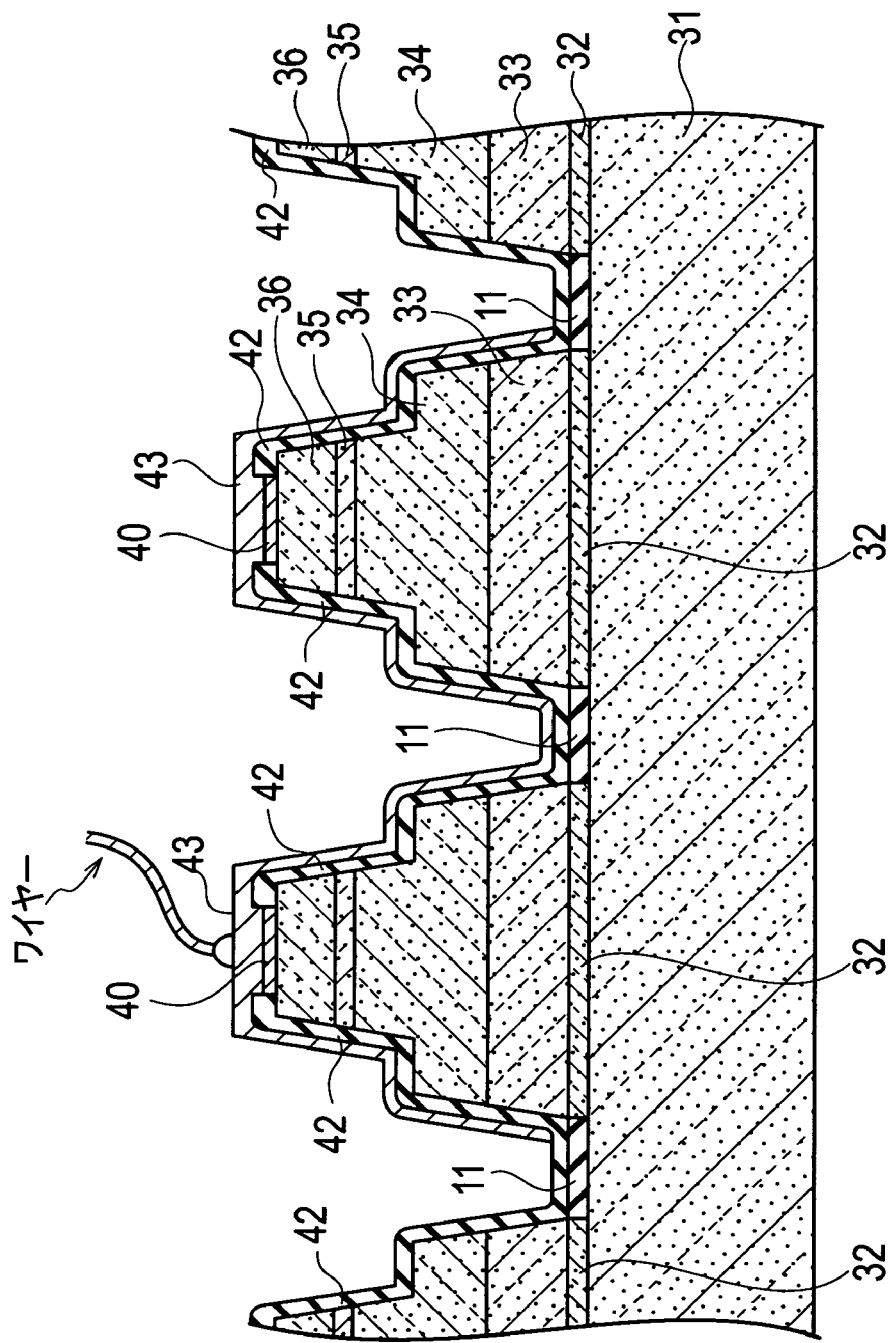
FIG. 6 is a diagram showing an example of a cross-sectional structure of a semiconductor light emitting device taken along the C-C of FIG. 8.

Two semiconductor light emitting elements arranged side-by-side in the center of FIG. 6, and semiconductor light emitting elements drawn by dotted lines in each of FIGS. 8A and 8B are shown as semiconductor light emitting elements used for wire bonding. As clear from FIGS. 6, 7, 8A, 8B, the metal 43 for bonding is formed continuously and unitarily over the entire top surfaces of each two neighboring semiconductor light emitting elements and the isolation groove between the two neighboring semiconductor light emitting elements.

The metal 43 for bonding is continuously formed on not only a portion of the insulating film 42 situated in the top surface of each semiconductor element, but also a portion of the insulating film 42 situated on the side surface of the semiconductor element. Namely, the metal 43 for bonding is formed in a way to cover the semiconductor element completely. Subsequently, the metal 43 for bonding is continuously formed to cover the mask 11 for selective growth situated between the semiconductor element and its neighboring semiconductor element, and is further continuously and unitarily formed to completely cover the top and side surfaces of the neighboring semiconductor element.

The metal 43 for bonding is electrically connected to the p-electrodes 40 or the n-electrodes 39 through the respective contact holes made in the insulating film 42. The metal 43 for bonding is a metal electrode for wire bonding, and is made of Au (gold) or Al (aluminum). The metal 43 for bonding is formed with a thickness of approximately 8000 Å (0.8 μm).

Subsequently, as illustrated in the drawing, a wire is bonded to some location of the top of the metal 43 for bonding by solder or the like. The electric power is supplied from this wire through the metal 43 for bonding. On the other hand, although not illustrated, a metal interconnection for supplying the electric power from the semiconductor light emitting elements for wire bonding to the other semiconductor light emitting elements is laid out. In addition, although not illustrated, metal interconnections each for connecting electrodes with the same polarity together, or metal interconnections each for connecting electrodes with the opposite polarities together are formed for the p-electrodes 40 and the n-electrodes 39 of each two neighboring semiconductor light emitting elements, as shown in FIGS. 4A, 4B and 5.

FIG. 6 shows a wire bonding section for the positive electrode. On the other hand, a wire bonding section for the negative electrode may be configured as follows. Two neighboring semiconductor light emitting elements which are different from the semiconductor light emitting elements for wire bonding for the positive electrode shown in FIG. 6 are selected, and a metal for bonding is formed on the thus-selected two neighboring semiconductor light emitting elements with the configuration shown in FIG. 6. The thus-formed metal for bonding is connected to the n-electrodes 39.

At least two semiconductor elements are needed to continuously and unitarily form the metal for bonding for the positive electrode or the negative electrode. With two or more semiconductor elements, the strength of the bonding becomes stronger, and the metal for bonding becomes less likely to come off. As described above, the bonding strength is enhanced by increasing the bonding area between the metal electrode for wire bonding and the semiconductor elements. This makes the metal electrodes for wire bonding (metal 43 for bonding) less likely to come off than ever before even when an excessive force is applied to the wire.

The method of manufacturing the semiconductor devices shown FIGS. 6, 7, 8A and 8B is identical to the method of manufacturing the semiconductor devices shown in FIGS. 1, 4A, 4B and 5 up to a step of forming the metals 43 for bonding. Thus, the descriptions thereof will be omitted.

The manufacturing of each metal 43 for bonding and the connecting of the corresponding wire are achieved as follows. Contact holes are made by removing portions of $SiO_2$ from the top of each of the p-electrode 40 and the n-electrode 39 by etching. Thereafter, at least two neighboring semiconductor elements are selected to form the metal electrode for wire bonding thereon, and the metal 43 for bonding is continuously and unitarily formed on the thus-selected neighboring semiconductor elements in a way that the isolation groove therebetween is buried under the metal 43 for bonding. Subsequently, the wire for supplying the electric power is bonded to some location on the top of the metal 43 for bonding.

The invention claimed is:

1. A semiconductor light emitting device in which a plurality of hexagon-shaped semiconductor light emitting elements are formed two-dimensionally on a substrate, the semiconductor light emitting device comprising:
   in each semiconductor light emitting element, a positive electrode and a negative electrode are formed on a hexagon-shaped light outputting surface side; and
   a positive electrode of one of each two neighboring ones of the semiconductor light emitting elements and a negative electrode of the other element are arranged adjacent to each other with an isolation groove in between, the isolation groove isolating the semiconductor light emitting elements from one another.

2. The semiconductor light emitting device according to claim 1, wherein a metal electrode for wire bonding is continuously formed stretching across front surfaces respectively of at least two adjacent ones of the semiconductor light emitting elements, the metal electrode configured to supply electric power to the semiconductor light emitting device.

3. The semiconductor light emitting device according to claim 2, wherein the metal electrode is continuously formed stretching across the top surface and a side surface of each of the semiconductor light emitting elements.

4. The semiconductor light emitting device according to claim 1, wherein, in each semiconductor light emitting element, the positive electrode and the negative electrode are each formed in a shape using one side of, or two sides meeting at a vertex of, the hexagon, and the positive electrode and the negative electrode are arranged opposed to each other.

5. The semiconductor light emitting device according to claim 4, wherein at least one of the positive electrode and the negative electrode of each semiconductor light emitting element is formed in a shape of a rectangle including long sides which are parallel to the one side of the hexagon defining the hexagon shape of the element.

6. The semiconductor light emitting device according to claim 4, wherein at least one of the positive electrode and the negative electrode of each semiconductor light emitting element is formed in a V-shape using two sides parallel respectively to the two sides meeting at the vertex of the hexagon defining the hexagon shape of the element.

7. The semiconductor light emitting device according to claim 4, wherein at least one of the positive electrode and the negative electrode of each semiconductor light emitting element is formed in a shape of any one of a sector and a triangle using two sides parallel respectively to the two sides meeting at the vertex of the hexagon defining the hexagon shape of the element.

8. The semiconductor light emitting device according to any one of claims 5, 6, and 7, wherein a metal electrode for wire bonding is continuously formed stretching across front surfaces respectively of at least two adjacent ones of the semiconductor light emitting elements, the metal electrode configured to supply electric power to the semiconductor light emitting device.

9. The semiconductor light emitting device according to claim 8, wherein the metal electrode is continuously formed stretching across the top surface and a side surface of each of the semiconductor light emitting elements.

10. The semiconductor light emitting device according to claim 4, wherein a metal electrode for wire bonding is continuously formed stretching across front surfaces respectively of at least two adjacent ones of the semiconductor light emitting elements, the metal electrode configured to supply electric power to the semiconductor light emitting device.

11. The semiconductor light emitting device according to claim 10, wherein the metal electrode is continuously formed stretching across the top surface and a side surface of each of the semiconductor light emitting elements.

* * * * *